US007301782B2

(12) United States Patent
Lee et al.

(10) Patent No.: US 7,301,782 B2
(45) Date of Patent: Nov. 27, 2007

(54) CONNECTOR DEVICE AND DISPLAY DEVICE USING THE SAME

(75) Inventors: Bong-ju Lee, Suwon-si (KR); Byung-jo Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 133 days.

(21) Appl. No.: 11/122,999

(22) Filed: May 6, 2005

(65) Prior Publication Data

US 2005/0272297 A1 Dec. 8, 2005

(30) Foreign Application Priority Data

Jun. 8, 2004 (KR) ...................... 10-2004-0041594

(51) Int. Cl.
*H05K 7/14* (2006.01)
*H05K 7/18* (2006.01)

(52) U.S. Cl. ...................... 361/801; 361/752; 361/715; 439/329; 439/368

(58) Field of Classification Search ................ 361/715, 361/752, 852, 753, 801–802; 439/345, 368, 439/371–373, 358, 79, 567, 486, 329
See application file for complete search history.

(56) References Cited

U.S. PATENT DOCUMENTS 4,407,556 A * 10/1983 Hoschett ...................... 439/358
4,418,976 A * 12/1983 Lenzini et al. .............. 439/358
4,718,866 A * 1/1988 Yamaguchi ................. 439/607
5,623,392 A * 4/1997 Ma ............................ 361/681
5,693,908 A * 12/1997 Amberger ................... 174/656
5,707,249 A * 1/1998 Byrd .......................... 439/500
6,091,601 A 7/2000 Schlesener et al.
6,939,161 B1 * 9/2005 Yi et al. ..................... 439/373
2001/0027039 A1 * 10/2001 Okabe et al. ................. 439/79

FOREIGN PATENT DOCUMENTS

| | | | |
|---|---|---|---|
| DE | EP 0 262 432 | * | 9/1987 |
| JP | 11-65742 | | 3/1999 |
| KR | 1995-0004649 | | 2/1994 |
| KR | 10-0288007 | | 4/2001 |
| KR | 2001-97971 | | 11/2001 |
| KR | 2002-96531 | | 12/2002 |
| KR | 2003-0095132 | | 12/2003 |

OTHER PUBLICATIONS

International Search Report issued on Sep. 7, 2005, for Korean Patent Application No. PCT/KR2005/001580.

* cited by examiner

*Primary Examiner*—Dean A. Reichard
*Assistant Examiner*—Hung S Bui
(74) *Attorney, Agent, or Firm*—Stanzione & Kim, LLP

(57) ABSTRACT

A connector device and a display device using the same include an image displaying panel to display an image, a PCB to operate the image displaying panel, at least one cable port provided in the PCB, at least one cable connecter provided to be coupled to the cable port, and a connector holder disposed adjacent to the cable port to prevent the cable connector from being separated from the cable port. Thus the connector device and the display device using the same can prevent a cable mounted on a PCB from being separated therefrom.

39 Claims, 7 Drawing Sheets

CONNECTOR DEVICE AND DISPLAY DEVICE USING THE SAME

CROSS-REFERENCE TO RELATED APPLICATIONS

This application claims the benefit of Korean Patent Application No. 2004-41594, filed on Jun. 8, 2004, in the Korean Intellectual Property Office, the disclosure of which is incorporated herein in its entirety by reference.

BACKGROUND OF THE INVENTION

1. Field of the Invention

The present general inventive concept relates to a connector device and a display device using the same, and more particularly, to a connector device and a display device using the same to prevent a cable mounted on a PCB (Printed Circuit Board) from being separated therefrom.

2. Description of the Related Art

A display device includes televisions, monitors for computers, etc., and is classified into a CRT monitor, an LCD monitor, a PDP monitor, etc.

Nowadays, a thin display device using an image displaying panel, such as an LCD (Liquid Crystal Display), a PDP (Plasma Display Panel), etc., is widely used.

Hereinafter, the description will be given with regard to the thin display device by way of an example.

A conventional display device comprises a casing formed with an accommodating space therein, an image displaying panel disposed in the accommodating space and displaying an image, and a PCB electrically connected to the image displaying panel and including a plurality of operating elements so as to operate the image displaying panel.

The conventional display device includes the PCB to which kinds of cables like a power cable are connected. The cables are connected to the PCB by a connector soldering, etc. When the cables are connected to the PCB by soldering, the cables may be disconnected therefrom due to an external force. Also, when the cable is detachably connected to the PCB by the connector, the cable may be disconnected therefrom due to the external force.

FIG. 1 is a schematic view illustrating a conventional LCD (Liquid Crystal Display) apparatus 101 having a disconnection preventing structure of a cable of a back light apparatus. The LCD apparatus 101 includes a guide 110 guiding the cable (not shown) from a lamp of the back light apparatus so as to prevent a disconnection of the cable therefrom. The guide 110 guides the cable to prevent the cable connected to the lamp of the back light apparatus from being disconnected therefrom.

However, when the cable is detachably connected to the PCB using the connector, etc., the cable is still easily disconnected therefrom. Accordingly, a structure preventing the disconnection of the cable is required to the conventional LCD apparatus.

SUMMARY OF THE INVENTION

In order to solve the foregoing and/or other problems, it is an aspect of the present general inventive concept to provide a connector device and a display device using the same to prevent a cable mounted on a PCB from being separated therefrom.

Additional aspects and/or advantages of the invention will be set forth in part in the description which follows and, in part, will be obvious from the description, or may be learned by practice of the invention.

The foregoing and/or other aspects of the present general inventive concept may be achieved by providing a connector device and a display device using the same, the display device comprising an image displaying panel to display an image, a PCB to operate the image displaying panel, at least one cable port provided in the PCB, at least one cable connector provided to be coupled to the cable port, and a connector holder disposed adjacent to the cable port to prevent the cable connector from being separated from the cable port.

According to an aspect of the present general inventive concept, the connector holder may comprise a stopper to contact a rear side of the cable connector when the cable port is coupled to the cable connector.

According to another aspect of the present general inventive concept, the connector holder may be detachably mounted on the PCB.

According to yet another aspect of the present general inventive concept, the PCB may further comprise at least one hook coupling hole formed adjacent to the connector holder, and the connector holder may further comprise at least one first hook accommodated in the hook coupling hole.

According to still another aspect of the present general inventive concept, the connector holder may further comprise at least one second hook separated from the first hook and coupled to a side of the PCB.

According to another aspect of the present general inventive concept, the connector holder may further comprise a grip projected adjacent to the second hook so as to separate the connector holder from the PCB.

According to another aspect of the present general inventive concept, the connector holder may further comprise a through hole formed on a surface of the connector holder to confirm separation or coupling of the cable connector therethrough.

The foregoing and/or other aspects of the present general inventive concept may also be achieved by providing a connector holder disposed on a PCB, the connector comprising at least one cable port and a cable connector provided to be coupled to the cable port, the connector holder being disposed adjacent to the cable port to prevent the cable connector from being separated from the cable port.

BRIEF DESCRIPTION OF THE DRAWINGS

These and other aspects and advantages of the general inventive concept will become apparent and more readily appreciated from the following description of the embodiments, taken in conjunction with the accompany drawings of which.

DETAILED DESCRIPTION OF THE PREFERRED EMBODIMENTS

Figure 1:
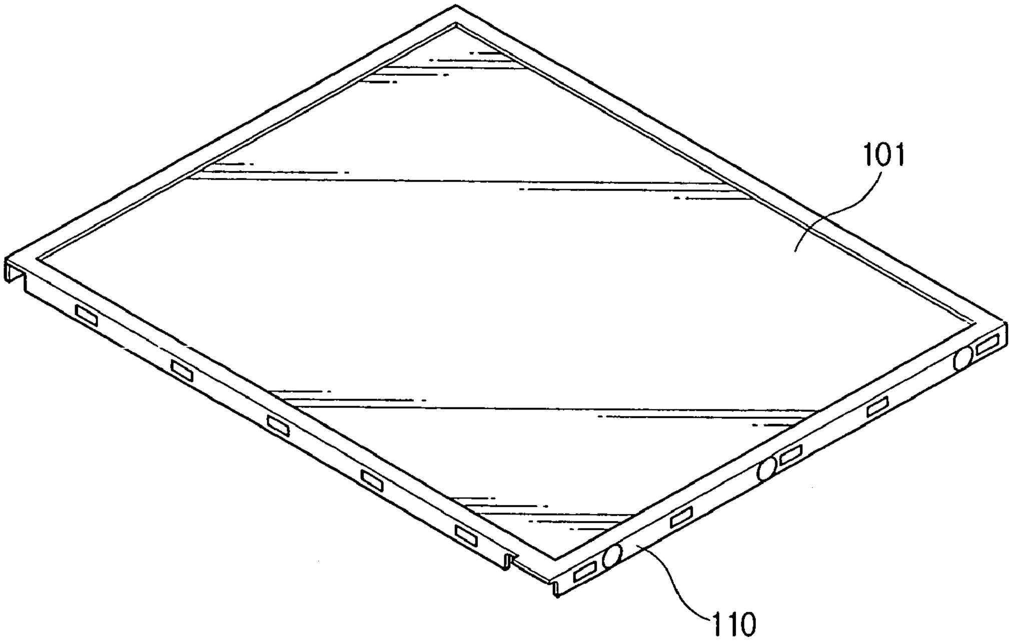
FIG. 1 (PRIOR ART)
FIG. 1 is a schematic view illustrating a conventional LCD apparatus.

Reference will now be made in detail to the embodiments of the present general inventive concept, examples of which are illustrated in the accompanying drawings, wherein like reference numerals refer to like elements throughout. The embodiments are described below in order to explain the present invention by referring to the figures.

Figure 2:
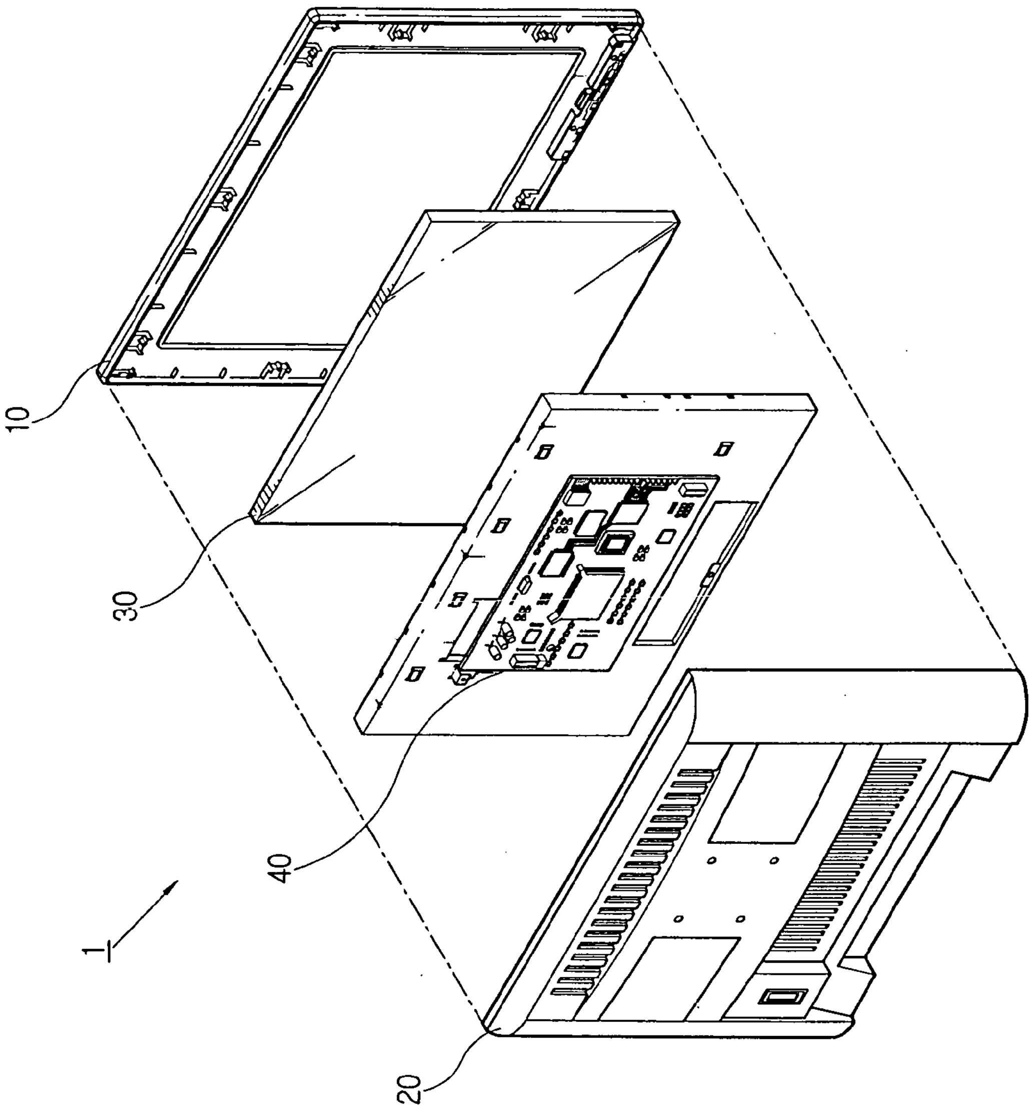
FIG. 2 is an exploded perspective view illustrating a display device according to an embodiment of the present general inventive concept.

As shown in FIG. 2, a display device 1 according to an embodiment of the present general inventive concept may comprise a front casing 10 and a rear casing 20 coupled to each other to form an accommodating space therein. The display device 1 may further comprise an image displaying panel 30 disposed inside of the accommodating space and including a displaying surface to display an image, and a PCB 40 electrically connected to the image displaying panel 30 and transmitting electric signals to the image displaying panel 30 so as to display the image.

Figure 3:
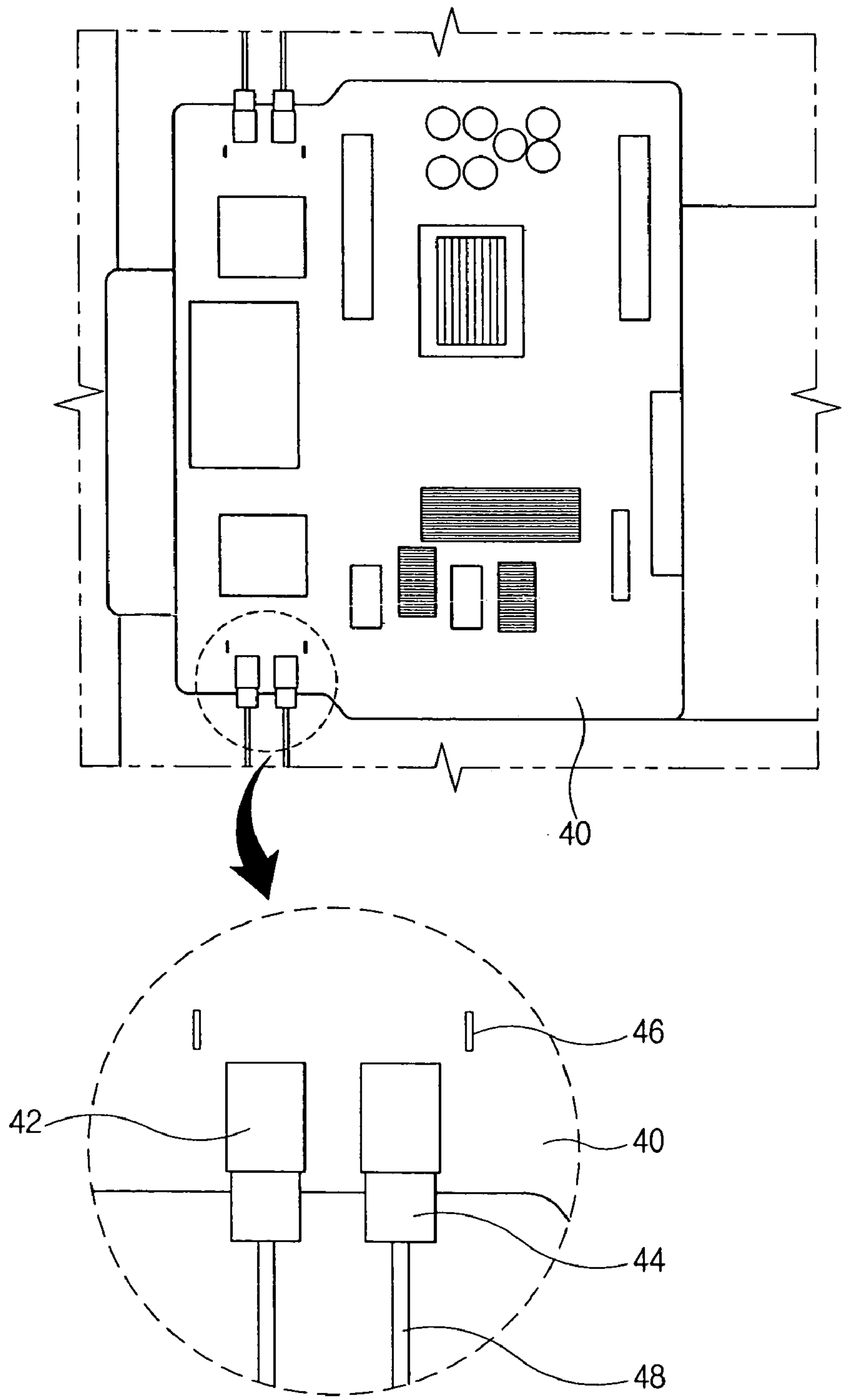
FIG. 3 is a front view illustrating a PCB of the display device of FIG. 2.
Figure 4:
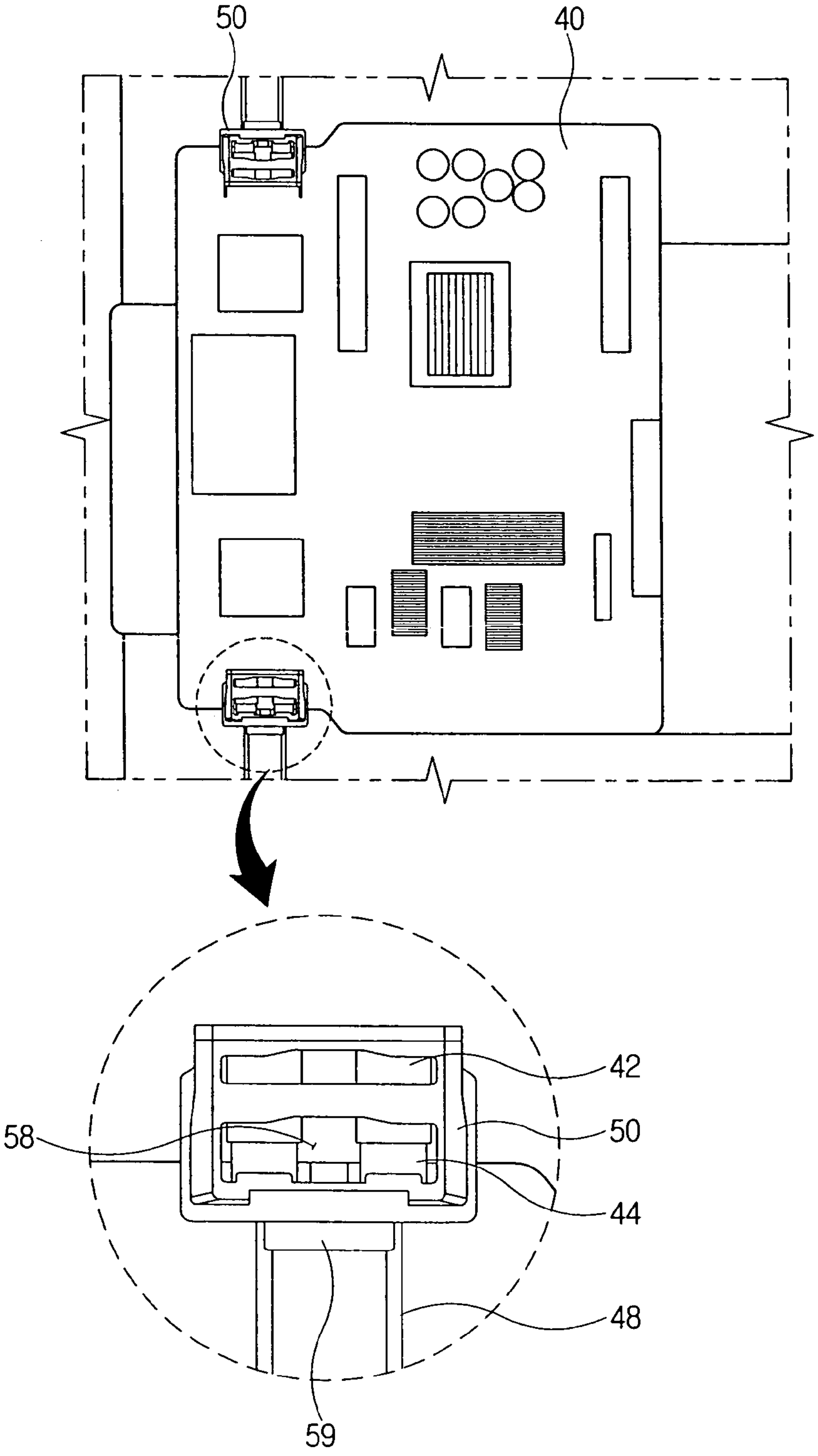
FIG. 4 is a front view illustrating a PCB coupled to a connector holder of a display device according to another embodiment of the present general inventive concept.

As shown in FIG. 3, the PCB 40 may include cable ports 42 at a side thereof. Also, the PCB 40 may further include cable connectors 44 detachably coupled to the cable ports 42. The cable connectors 44 can be connected to inverter cables 48 supplying power to the PCB 40. The PCB 40 may further include hook coupling holes 46 disposed adjacent to the cable ports 42 and accommodating a connector holder 50 (FIG. 4).

The cable ports 42 can be a box shape, can be projected at a side of the PCB 40, and can be provided in a pair being separated by a predetermined distance. The cable ports 42 can be formed with an accommodating space (not shown) to accommodate the cable connectors 44 therein.

The cable connectors 44 can be provided in a pair and may have a box shape to correspond to the accommodating space of the cable ports 42. First ends of the cable connectors 44 can be respectively accommodated in the cable ports 42, and second ends of the cable connectors 44 can be respectively connected to the inverter cables 48 so that the power can be supplied to the PCB 40.

The hook coupling holes 46 can be formed by perforating the PCB 40. The hook coupling holes 46 can be separated from the cable ports 42 by a predetermined distance and can be provided in a pair at an outside of the cable ports 42 to accommodate first hooks 52 (FIG. 5) so that the connecter holder 50 is coupled to the PCB 40.

Figure 5:
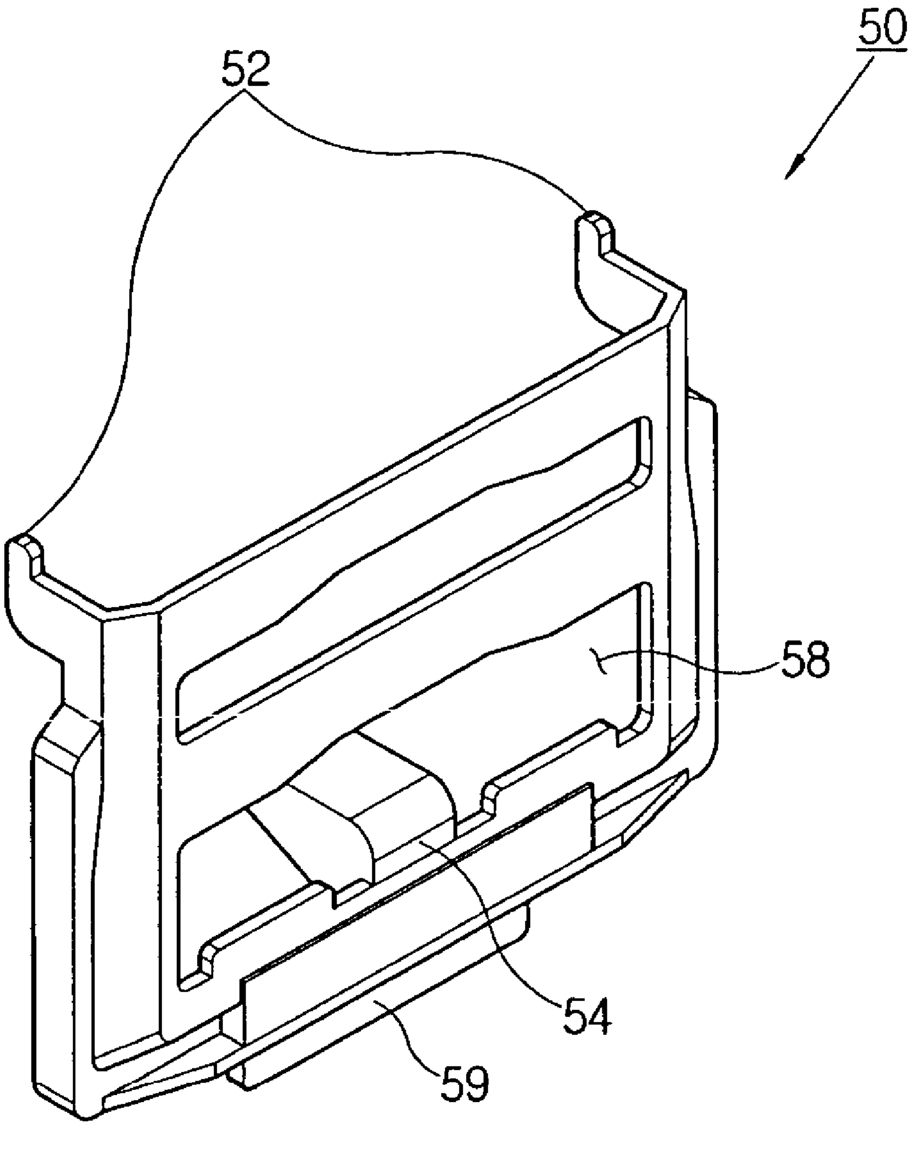
FIG. 5 is a perspective view illustrating a connector holder of the display device of FIG. 4.
Figure 6:
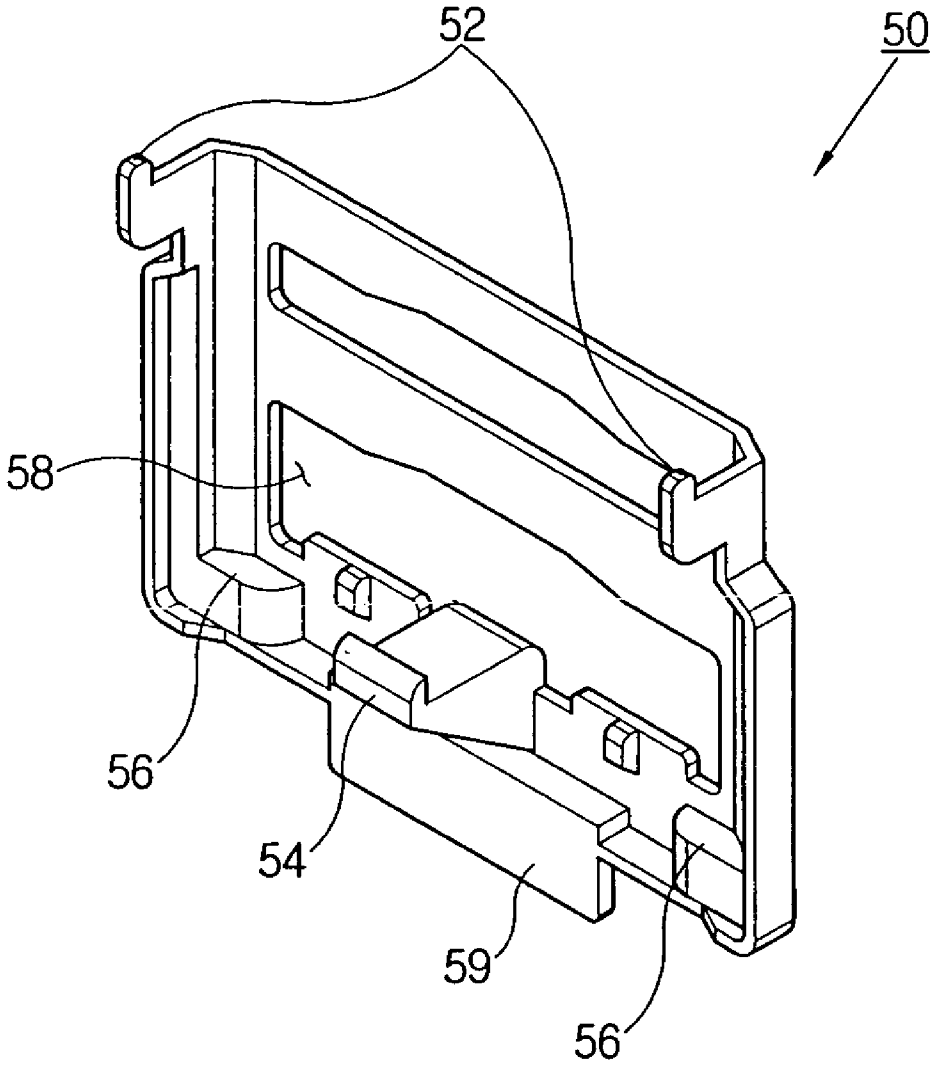
FIG. 6 is a rear view illustrating the connector holder of the display device of FIG. 4.
Figure 7:
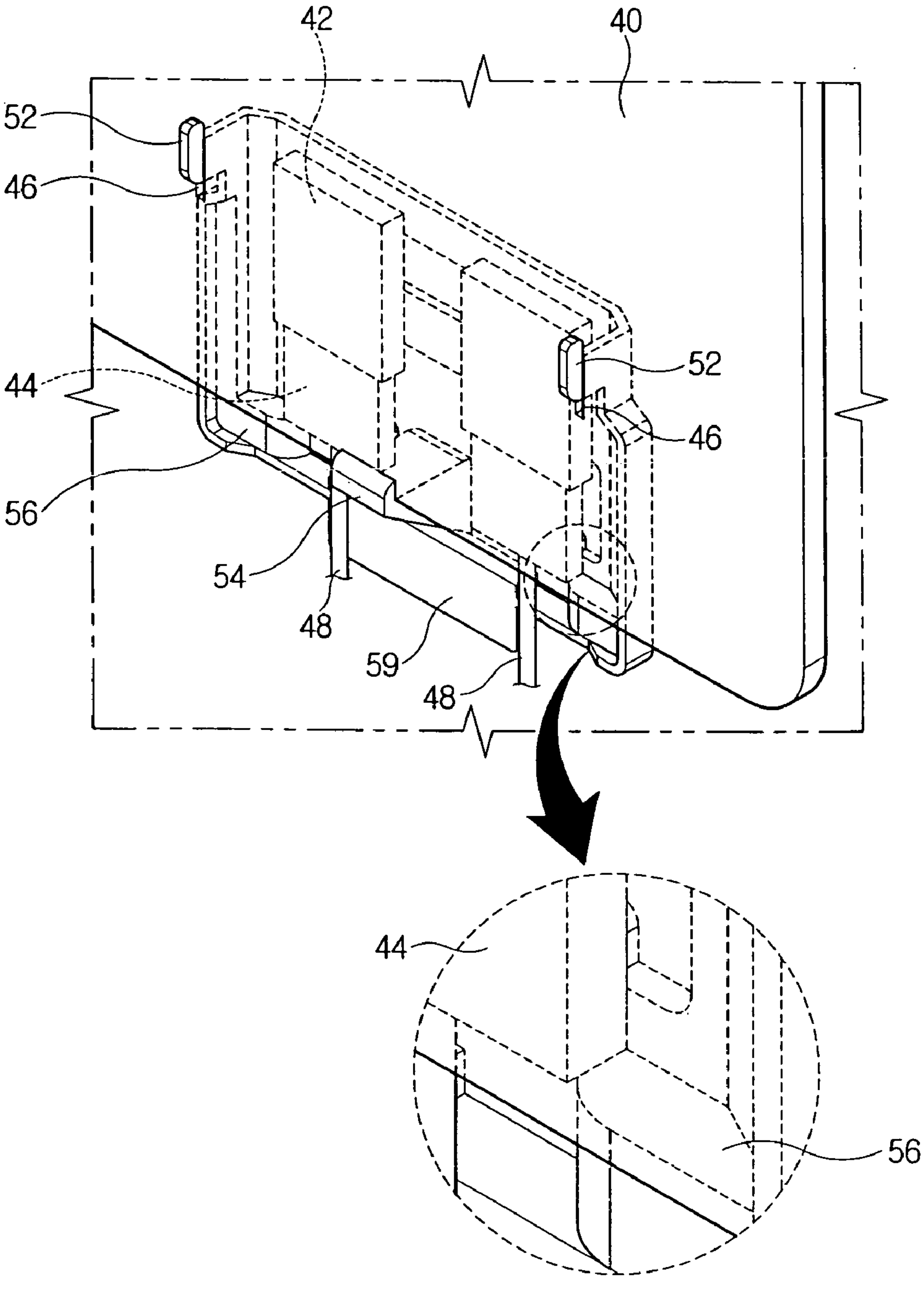
FIG. 7 is a rear view illustrating a coupling state of a connector holder of a display device according to another embodiment of the present general inventive concept.

As shown in FIGS. 4 through 6, the connecter holder 50 may comprise at a rear side thereof the first hooks 52 and a second hook 54 to detachably couple the connector holder 50 to the PCB 40. Also, the connector holder 50 may further include a pair of stoppers 56 disposed adjacent to the second hook 54 to prevent the cable connectors 44 from being separated therefrom, and a through hole 58 through which the separation or the coupling of the cable connectors 44 can be confirmed by a user. The connector holder 50 may include a grip 59 projected between the pair of stoppers 56 to separate the connector holder 50 from the PCB 40.

As shown in FIG. 6, the first hooks 52 can be extended from a rear side of the connector holder 50, can be separated from each other to be accommodated in the pair of hook coupling holes 46, respectively, and can be disposed in opposite ends of a first side of the connector holder 50. The first hooks 52 can be bent at ends of a protruding part and can be coupled to the PCB 40 through the hook coupling holes 52. The first hooks 52 can be employed to prevent the connector holder 50 from being separated from the PCB 40.

The second hook 54 can project from the rear side of the connector holder 50, can be separated by a predetermined distance from the first hooks 52, and can be disposed at a center portion of a second side of the connector holder 50. The second hook 54 can couple the connector holder 50 to the PCB 40 by hooking at a side of the PCB 40 without coupling holes, etc. The second hook 54 can be disposed between the pair of cable connecters 44 so as to stably couple the second side of the connector holder 50 to the PCB 40.

The pair of stoppers 56 can be respectively disposed in the same side as the second hook 54 and can project to be separated from the second hook 54. The stoppers 56 can contact rear sides of the cable connectors 44 in a state that the cable connectors 44 are coupled to the cable ports 42. The stoppers 56 push the cable connectors 44 to the cable ports 42 to prevent the cable connectors 44 from being undesirably separated from the cable ports 42. Accordingly, a separating distance between the stoppers 56 can correspond to a distance between the cable connecters 44.

The through hole 58 can be disposed adjacent to the second hook 54 and the stoppers 56 and can be formed at a surface of the connector holder 50. A side of a wall defining the through hole 58 can be formed with the second hook 54 extended from the rear side of the connector holder 50 and the stoppers 56. Because the through hole 58 is formed adjacent to the stoppers 56, users are able to directly confirm whether the cable connectors 44 are exactly coupled to the cable ports 42.

The grip 59 can project from a side of the connector holder 50 including the second holder 54 and the stoppers 56. When the users raise the grip 59, the second hook 54 hooked at a side of the PCB 40 can be separated from the PCB 40 so that the connector holder 50 is easily separated therefrom.

A coupling and a detaching processes of the connector holder 50 of the display device 1 according to the present general inventive concept are described by referring to FIGS. 2-7 as follows.

First, the cable connectors 44 can be coupled to the cable ports 42 disposed at the PCB 40.

Then, the first hooks 52 of the connecter holder 50 can be inserted into the hook coupling holes 46 formed by perforating the PCB 40, and the second hook 54 can be hooked at a side of the PCB 40 by pushing the grip 59 of the connecter holder 50. The hook coupling holes 46 can be formed to be larger than the first hooks 52 in area so that the first hooks 52 are easily inserted thereinto.

When the connecter holder 50 is coupled to the PCB 40, the cable connectors 44 can be prevented from being separated from the cable ports 42 because the stoppers 56 contact a rear side of the cable connectors 44.

Because the hook coupling holes 46 are larger than coupling parts of the first hooks 52, the connecter holder 50 may be swayed in a case that the connector holder 50 is coupled to the PCB 40. Accordingly, the second hook 54 and the stoppers 56 of the connector holder 50 can be designed so as to compensate for a moving distance by which each of the first hooks 52 moves from one side of the hook coupling hole 46 to the other side of the hook coupling hole 46. However, the second hook 54 may get nearer to the first hooks 52 as far as the first hooks 52 sway inside the hook coupling holes 46.

A process separating the connecter holder 50 from the PCB 40 can be opposite to the coupling process. In other words, when the grip 59 is raised therefrom, the second hook 54 can be separated from the PCB 40 and in a case that the grip 59 is raised higher, the first hooks 52 can be separated from the hook coupling holes 46 so that the connector holder 50 is separated from the PCB 40.

As described above, the display device may comprise an LCD monitor, but the display device may comprises a CRT monitor, a PDP monitor, etc. A connector can be used in all kinds of boards, such as the PCB 40, as well as the display panel.

As described above, the cable ports 42 and the cable connectors 44 have a box shape, but various shapes can also be used for the cable parts 42 and the cable connectors 44. Accordingly, a shape of the connectors holder 50 to support the cable connectors 44 may vary or may be modified to correspond to the cable connectors 44.

As described above, the connector holder 50 can be used to prevent the cable connectors 44 connected to the inverter cables 48 supplying power to the PCB 40 from being separated from the cable ports 42, but the connecter holder 50 may be applied to different devices in which the cable connectors 44 are used.

As described above, the hook coupling holes 46 and the first hooks 52 can be provided in a pair, but the number of the hook coupling holes 46 and the first hooks 52 is not limited thereto so far as the connector holder 50 can be stably coupled.

As described above, the second hook 54 can be provided in a single hook disposed at a center portion of a side of the connector holder 50, but the number of the connector holders 50 is not limited thereto so far as the connector holders 50 can be stably coupled thereof.

As described above, the second hook 54 can couple the connector holder 50 to the PCB 40 by hooking at a side of the PCB 40 but the connector holder 50 may be coupled thereto by coupling holes, etc.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device comprising:

an image displaying panel to display an image;

a PCB to operate the image displaying panel, and having a hook coupling hole formed on an inside of the PCB;

at least one cable port provided in the PCB;

at least one cable connector to be coupled to the cable port; and a connector holder disposed adjacent to the cable port, and having a first hook coupled to the PCB through the hook coupling hole, a second hook coupled to an edge side of the PCB, and a stopper to prevent the cable connector from being separated from the cable port, wherein the first hook comprises sub-hooks spaced apart from each other, and the second hook is disposed between the sub-hooks.

2. The display device of claim 1, wherein the stopper contacts a rear side of the cable connector when the cable port is coupled to the cable connector.

3. The display device of claim 1, wherein the connector holder is detachably mounted on the PCB.

4. The display device of claim 1, wherein the hook coupling hole is formed adjacent to the connector holder, and the first hook of the connector holder is inserted into the hook coupling hole.

5. The display device of claim 4, wherein the connector holder is disposed adjacent to the cable connector.

6. The display device of claim 1, wherein the connector holder comprises a grip to project therefrom adjacent to the second hook so as to separate the connector holder from the PCB.

7. The display device of claim 1, wherein the connector holder comprises a through hole formed in a surface of the connector holder to expose a separation or coupling state of the cable connector and the cable port therethrough.

8. The display device of claim 1, wherein the at least one cable port and the at least one cable connector are disposed between the PCB and the connector holder, and the connector holder comprises a through hole formed to correspond to a connection portion of the at least one cable port and the at least one cable connector.

9. The display device of claim 1, wherein the connector holder comprises a main plate, the first hook is formed on a first side of the main plate to be coupled to a first portion of the PCB, and the second hook is formed on a second side of the main plate to be coupled to a second portion of the PCB.

10. The display device of claim 9, wherein the first side and the second side are disposed adjacent to the at least one cable port and the at least one cable connector, respectively.

11. The display device of claim 9, wherein the main plate of the connector holder is disposed to face a first surface of the at least one cable connector, and the stopper is formed on the main plate to face a second surface of the at least one cable connector.

12. The display device of claim 9, wherein the at least one cable connector has a thickness in a direction of a connection direction in which the at least one cable connector is inserted in and connected to the at least one cable port, and the stopper protrudes from the main plate toward the PCB by a distance in the direction to prevent the at least one cable connector from being released from the at least one cable port.

13. The display device of claim 9, wherein the PCB comprises a first surface on which the at least one cable connector is disposed to be connected to the at least one cable port, and a second surface opposite to the first surface, and the first hook and the second hook are extended from the main plate toward the second surface of the PCB by a distance equal to or greater than a sum of a thickness of the PCB between the first surface and the second surface and a thickness of the at least one cable connector.

14. The display device of claim 13, wherein the second hook is disposed on a third surface connected between the first and second surfaces of the PCB.

15. The display device of claim 10, wherein the at least one cable port comprises two cable ports, the at least one cable connector comprises two cable connectors connected to corresponding ones of the two cable ports, and the stopper comprises two sub-stoppers to prevent corresponding ones of the two cable connector from being disconnected from the two cable ports.

16. The display device of claim 15, wherein the connector holder comprises a main plate, a first hook extended from the main plate and coupled to a first portion of the PCB, and a second hook extended from the main plate, coupled to a second portion of the PCB, and disposed between the two cable connectors.

17. The display device of claim 16, wherein the two sub-stoppers are disposed opposite to each other with respect to the second hook.

18. The display device of claim 16, wherein the connector holder comprises a through hole formed on the main plate between the first hook and the second hook to correspond to a connection portion between the corresponding one of the two cable connectors and the cable ports.

19. The display device of claim 1, wherein the connector holder comprises a main plate, the first hook is formed on a first side of the main plate and disposed to be spaced-apart from the second hook to be coupled to two first portions of the PCB, and the second hook is formed on a second side of the main plate and disposed opposite to the first side to be coupled to a second portion of the PCB.

20. A connector holder used with a display device having a PCB and at least one cable port and a cable connecter coupled to the cable port, the connector holder comprising:

a first hook to be coupled to an inside of the PCB;

a second hook to be coupled to an edge side of the PCB; and a stopper to prevent the cable connector from being separated from the cable port when the connector is disposed adjacent to the cable port, wherein the first hook comprises sub-hooks, and the second hook is disposed between the sub-hooks.

21. The connecter holder of claim 20, wherein the stopper contacts a rear side of the cable connector when the cable port is coupled to the cable connector.

22. The connecter holder of claim 20, wherein the connector holder is detachably mounted on the PCB.

23. The connecter holder of claim 20, wherein the PCB comprises at least one hook coupling hole formed adjacent to the connector holder, and the first hook is accommodated in the hook coupling hole.

24. The connecter holder of claim 23, wherein the second hook is separated from the first hook in a direction in which the cable connector and the cable port are arranged.

25. The connecter holder of claim 20, further comprising:

a grip to project from a position adjacent to the second hook so as to separate the connecter holder from the PCB.

26. The connecter holder of claim 20, further comprising:

a through hole formed in a surface of the connecter holder to allow a user to confirm separation or coupling of the cable connector and the cable port therethrough.

27. The connector holder of claim 20, further comprising:

a main plate, wherein the first hook is extended from the main plate to be coupled to a first portion of the PCB, and the second hook is extended from the main plate to be coupled to a second portion of the PCB through the edge side of the PCB.

28. The connector holder of claim 27, wherein the stopper comprises two sub-stoppers disposed opposite to each other with respect to the second hook.

29. The connector holder of claim 27, wherein the main plate comprises a through hole formed between the first hook and the second hook, and a connection portion of the cable port and the cable connector is exposed through the through hole.

30. A connector holder usable in a display device having a PCB, comprising:

a main plate;

a first hook extended from a first portion of the main plate and having a first distal end extended in a coupling direction to be coupled to an external PCB; and a second hook extended from a second portion of the main plate and having a second distal end extended in the coupling direction to be coupled to the external PCB, wherein the first hooks comprise sub-hooks spaced apart from each other, and the second hook is disposed between the sub-hooks.

31. The connector holder of claim 30, wherein the first hook comprises a first extension formed on the first portion of the main plate in an extended direction, and the first distal end is formed on the first extension in the coupling direction.

32. The connector holder of claim 31, wherein the second hook comprises a second extension formed on the second portion of the main plate in the extended direction, and the second distal end is formed on the second extension in the coupling direction.

33. The connector holder of claim 30, wherein the sub-hooks are disposed in a direction perpendicular to the coupling direction.

34. The connector holder of claim 30, wherein the first hook and the second hook are coupled to first and second portions of the PCB, and the first and second portions of the PCB are separated from each other in the direction.

35. The connector holder of claim 30, wherein the first hook and the second hook are coupled to first and second portions of the PCB, the first portion is disposed in a middle portion of the PCB, and the second portion of the PCB is disposed in an edge portion of the PCB.

36. The connector holder of claim 30, further comprising:

a stopper formed on the main plate, wherein the external PCB comprises a cable port and a cable connector to be coupled to the cable port in the direction, and the stopper prevents the cable connecter from the cable port of the external PCB.

37. The connector holder of claim 30, wherein the external PCB comprises a cable port and a cable connector to be coupled to the cable port in the coupling direction, and the first and second hooks comprise first and second distal ends formed thereon in the coupling direction.

38. The connector holder of claim 30, wherein the external PCB comprises a cable port formed on a surface of the PCB and a cable connector to be coupled to the cable port in a direction parallel to the surface of the PCB.

39. The connector holder of claim 38, wherein the main plate covers the cable port and the cable connector when the second hooks and the main plate move to be coupled to edge side of the PCB with respect to the first hook and a coupling hole.

* * * * *